United States Patent
Shirakawa

(10) Patent No.: US 9,443,748 B2
(45) Date of Patent: Sep. 13, 2016

(54) SUBSTRATE PROCESSING APPARATUS, PROGRAM FOR CONTROLLING THE SAME, AND METHOD FOR FABRICATING SEMICONDUCTOR DEVICE

(75) Inventor: Makoto Shirakawa, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 603 days.

(21) Appl. No.: 13/435,284

(22) Filed: Mar. 30, 2012

(65) Prior Publication Data
US 2012/0258570 A1 Oct. 11, 2012

(30) Foreign Application Priority Data

Apr. 11, 2011 (JP) .................................. 2011-087401
Jan. 19, 2012 (JP) .................................. 2012-008958

(51) Int. Cl.
| H01L 21/50 | (2006.01) |
| --- | --- |
| B05C 11/00 | (2006.01) |
| B05C 13/00 | (2006.01) |
| H01L 21/67 | (2006.01) |
| H01L 21/677 | (2006.01) |
| H01L 21/687 | (2006.01) |

(52) U.S. Cl.
CPC ... *H01L 21/67276* (2013.01); *H01L 21/67745* (2013.01); *H01L 21/68735* (2013.01)

(58) Field of Classification Search
CPC ..................... H01L 31/0487; H01L 21/67276
USPC ....................................................... 700/121
See application file for complete search history.

(56) References Cited

U.S. PATENT DOCUMENTS

| 6,582,182 | B2* | 6/2003 | Whalen .......................... 414/276 |
| --- | --- | --- | --- |
| 8,078,311 | B2* | 12/2011 | Ogi ................... H01L 21/67196 414/935 |
| 2008/0149527 | A1* | 6/2008 | Sumi et al. .................... 206/710 |
| 2009/0099681 | A1* | 4/2009 | Arndt ................ H01L 21/67253 700/121 |
| 2009/0245981 | A1* | 10/2009 | Miyajima et al. ........ 414/222.02 |
| 2009/0294442 | A1* | 12/2009 | Igarashi et al. ............... 220/200 |
| 2010/0243867 | A1* | 9/2010 | Suzuki et al. ................. 250/215 |

FOREIGN PATENT DOCUMENTS

| JP | 2006-269810 A | 10/2006 |
| --- | --- | --- |
| JP | 2010-098247 A | 4/2010 |
| JP | 2010-161157 A | 7/2010 |
| JP | 4501674 B2 | 7/2010 |

* cited by examiner

*Primary Examiner* — Mohammad Ali
*Assistant Examiner* — John Park
(74) *Attorney, Agent, or Firm* — Volpe and Koenig, P.C.

(57) ABSTRACT

A substrate processing apparatus includes a mounting stand, a cover opening and closing unit, a substrate checking unit, a substrate transfer mechanism, a substrate processing unit, and a controller. While the substrate processing unit is processing a substrate within a first substrate accommodation container mounted on the mounting stand, when a second substrate accommodation container is mounted on the mounting stand, the controller provides control to open the cover of a second substrate accommodation container and check a substrate within the second substrate accommodation container by means of the substrate checking unit, and when the substrate checking is terminated, the controller provides control to close the cover of the second substrate accommodation container.

10 Claims, 6 Drawing Sheets

SUBSTRATE PROCESSING APPARATUS, PROGRAM FOR CONTROLLING THE SAME, AND METHOD FOR FABRICATING SEMICONDUCTOR DEVICE

CROSS-REFERENCE TO RELATED APPLICATIONS

This application is based upon and claims the benefit of priority from Japanese Patent Application Nos. 2011-87401 and 2012-8958, filed on Apr. 11, 2011 and Jan. 19, 2012, respectively, the entire contents of which are incorporated herein by reference.

TECHNICAL FIELD

The present disclosure relates to a substrate processing apparatus for processing a substrate such as a wafer or the like, a program for controlling the substrate processing apparatus, and a method for fabricating a semiconductor device, in which film formation processing or the like is performed on a semiconductor substrate (e.g., a semiconductor wafer) on which a semiconductor integrated circuit (hereinafter, referred to as 'IC') is fabricated. More particularly, the present disclosure relates to a substrate processing apparatus having a plurality of substrate accommodation containers accommodating a plurality of substrates, a program for controlling the substrate processing apparatus, and a method for fabricating a semiconductor device, in which substrates within a first substrate accommodation container are sequentially conveyed (or carried) individually to a processing chamber to be processed, and then, substrates within a second substrate accommodation container are sequentially conveyed individually to the processing chamber when the processing of the substrates within the first substrate accommodation container is terminated.

BACKGROUND

In the related art, a plurality of substrate accommodation containers are mounted on a load port of a substrate processing apparatus; the cover of, for example, a first substrate accommodation container, among the plurality of mounted substrate accommodation containers, is opened to check for the presence or absence or the positions of wafers accommodated therein; wafer mapping is performed to count the number of sheets of wafers; and the wafers (substrates) within the first substrate accommodation container are sequentially conveyed to a processing chamber individually and processed. After wafer mapping is performed for the first substrate accommodation container, the cover of a second substrate accommodation container is opened and wafer mapping is performed for the second substrate accommodation container. After wafer mapping for the second substrate accommodation container is terminated, the second substrate accommodation container is kept in a standby state with the cover thereof opened, and then, after processing of all of the substrates within the first substrate accommodation container is terminated, processing of the substrates within the second substrate accommodation container begins. In the related art, there is also known a substrate processing apparatus for sequentially carrying out substrates from a plurality of substrate accommodation containers mounted on a load port, conveying the substrate accommodation containers into a processing chamber, and processing the same in the processing chamber.

In the substrate processing apparatus of the related art, a cover of the plurality of substrate accommodation containers, for example, the cover of a first substrate accommodation container, is opened; wafer mapping is performed; and substrates within the first substrate accommodation container start to be processed, while, at the same time, the cover of a second substrate accommodation container is opened and wafer mapping is performed. However, in this case, even after wafer mapping for the second substrate accommodation container is terminated, the cover of the second substrate accommodation container kept in a standby state is maintained in an opened state. Thus, the wafers within the second substrate accommodation container in the standby state are exposed to the air within the substrate processing apparatus, providing the possibility in which particles may be attached to the surface of the wafers.

SUMMARY

The present disclosure provides some embodiments in which the cover of a substrate accommodation container is opened, processing such as wafer mapping or the like is performed, the cover of the substrate accommodation container kept in a standby state is closed, and, when processing of the substrates within the substrate accommodation container starts, the cover of the substrate accommodation container is opened again.

According to one embodiment of the present disclosure, there is provided a substrate processing apparatus, including a mounting stand on which a substrate accommodation container accommodating a plurality of substrates therein is held, a cover opening and closing unit configured to open and close a cover of the substrate accommodation container mounted on the mounting stand, a substrate checking unit configured to check for presence or absence or a position of a substrate within the substrate accommodation container with the cover thereof being opened, a substrate transfer mechanism configured to transfer a substrate within the substrate accommodation container to a processing chamber, a substrate processing unit configured to perform processing on the substrate within the processing chamber which has been transferred by substrate transfer mechanism, and a controller configured to control the operation of the cover opening and closing unit, substrate checking unit, substrate processing unit, and substrate transfer mechanism, wherein the substrate accommodation container includes a first substrate accommodation container and a second substrate accommodation container, and, while the substrate processing unit is processing a substrate transferred from the first substrate accommodation container to the processing chamber by the substrate transfer mechanism, when the second substrate accommodation container is mounted on the mounting stand, the controller provides control to open the cover of the second substrate accommodation container and check a substrate within the second substrate accommodation container by means of the substrate checking unit, and when the substrate checking is terminated, the controller provides control to close the cover of the second substrate accommodation container.

DETAILED DESCRIPTION

Exemplary embodiments of the present disclosure will now be described in detail with reference to the drawings.

Figure 1:
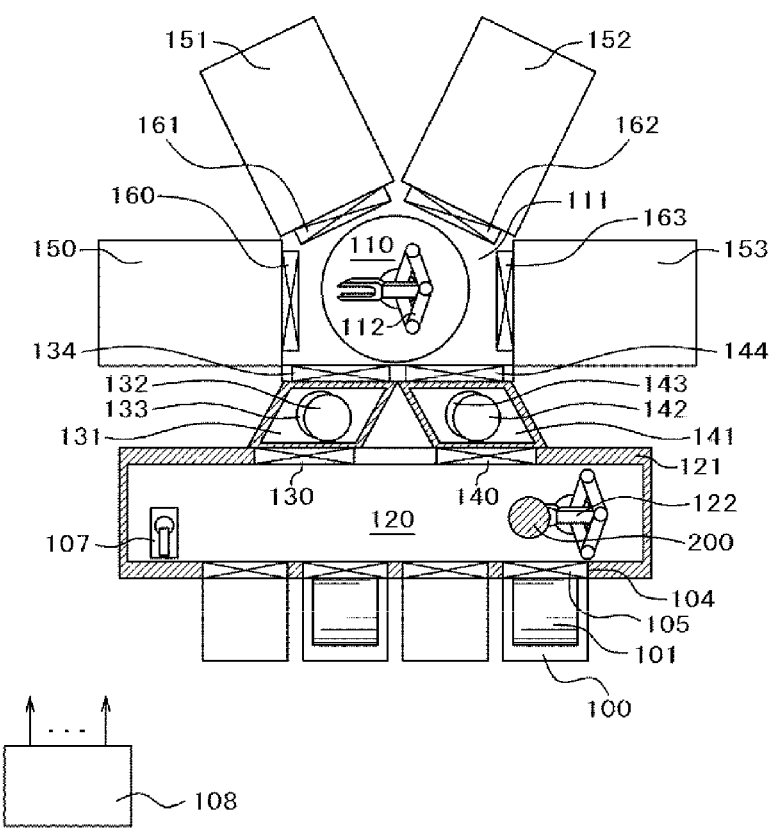
FIG. 1 is a plane view of a substrate processing apparatus according to an embodiment of the present disclosure.

A substrate processing apparatus 10 according to an embodiment of the present disclosure will be described with reference to FIGS. 1 and 2. FIG. 1 is a plan view of the substrate processing apparatus 10, and FIG. 2 is a side sectional view of the substrate processing apparatus 10.

In the substrate processing apparatus 10, a front opening unified pod (FOUP) (hereinafter, referred to as "pod") 101 is used as a carrier (substrate accommodation container) for conveying a substrate such as a wafer or the like. For example, the pod 101 may accommodate 25 sheets of wafers and have a cover for shutting an opening through which a wafer is carried in or out. An atmosphere within the pod 101 is isolated from an atmosphere outside the pod 101 by the cover, and the wafers within the pod 101 are prevented from being negatively affected by the atmosphere outside the pod 101.

Meanwhile, in the following descriptions, front, rear, left, and right directions (or all directions) are indicated based on FIG. 1. That is, the front direction is a direction of a second transfer chamber 120 when viewed from a first transfer chamber 110. The rear direction is a direction of the first transfer chamber 110 when viewed from the second transfer chamber 120. The left direction refers to a direction of a processing unit 150 when viewed from the first transfer chamber 110. The right direction refers to a direction of a processing unit 153 when viewed from the first transfer chamber 110.

Figure 2:
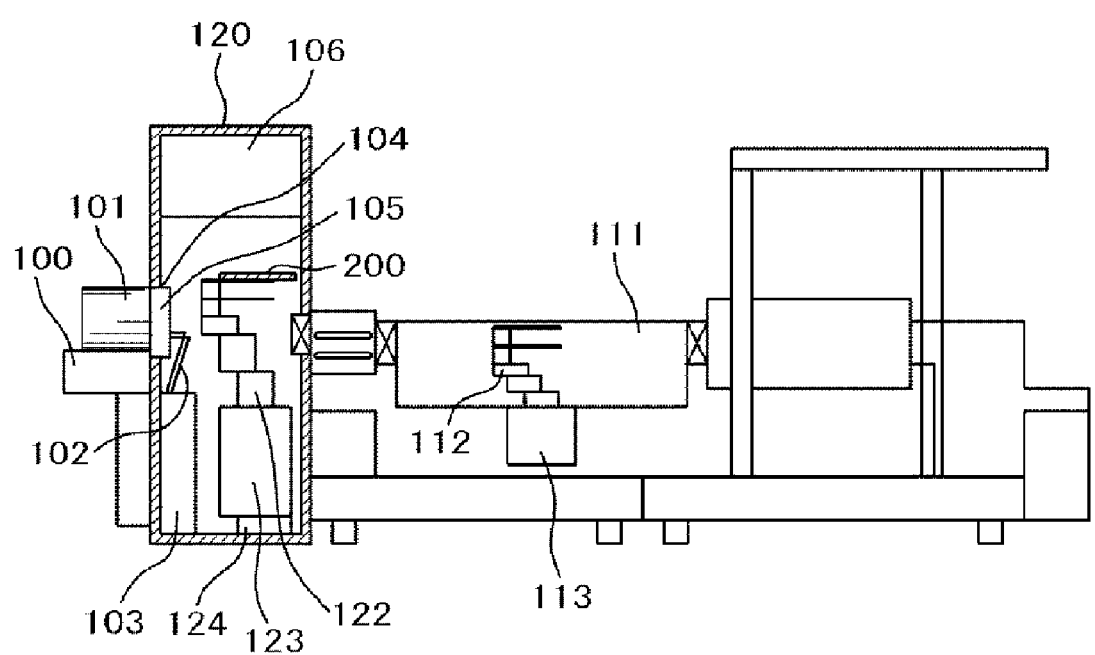
FIG. 2 is a side sectional view of the substrate processing apparatus.

As illustrated in FIGS. 1 and 2, the substrate processing apparatus 10 includes the first transfer chamber 110. The first transfer chamber 110 has a structure that can withstand a pressure (a negative pressure) which is lower than an atmospheric pressure, such as a vacuum state or the like. A main body 111 of the first transfer chamber 110 has a pentagonal closed box-like shape when viewed from above. A first wafer transfer device 112 is installed in the first transfer chamber 110. The first wafer transfer device 112 can simultaneously transfer two sheets of wafers 200 under a negative pressure, and is configured to be lifted or lowered by an elevator 113 in a state in which the first transfer chamber 110 is maintained to be air-tight.

Load lock chambers 131 and 141 are connected to the front side wall among the five side walls of the main body 111 of the first transfer chamber 110, with gate valves 134 and 144 interposed therebetween, respectively. The load lock chambers 131 and 141 have a structure capable of withstanding a negative pressure. Substrate mounting tables 132 and 133 on which a substrate is temporarily mounted are installed in the load lock chamber 131, and substrate mounting tables 142 and 143 on which a substrate is temporarily mounted are installed in the load lock chamber 141.

The second transfer chamber 120 which operates substantially under an atmospheric pressure is connected to the load lock chambers 131 and 141 with gate valves 130 and 140 interposed therebetween, respectively. A second wafer transfer device 122 is installed in the second transfer chamber 120. The second wafer transfer device 122 is able to simultaneously transfer two sheets of wafers 200, and is lifted and lowered by an elevator 123 installed in the second transfer chamber 120 and moved in a horizontal direction by a linear actuator 124.

A substrate transfer mechanism for transferring a substrate within a substrate accommodation container into the processing chamber mainly includes the first wafer transfer device 112 and the second wafer transfer device 122.

As shown in FIG. 1, a notch adjustment device 107 is installed at a left portion within the second transfer chamber 120. Further, as shown in FIG. 2, a clean unit 106 for supplying clean air is installed at an upper portion of the second transfer chamber 120.

As shown in FIGS. 1 and 2, a wafer loading/unloading hole 104 for loading and unloading a wafer 200 to and from the second transfer chamber 120, a door 105 for closing the wafer loading/unloading hole 104, and a pod opener 103 are installed in a main body 121 of the second transfer chamber 120. The pod opener 103 has a cap opening and closing mechanism 102 for opening and closing a cap (cover) of the pod 101 mounted on an Input/Output (I/O) stage (load port) 100. A mounting stand on which a plurality of substrate accommodation containers are mounted mainly includes the I/O stage 100. A cover opening and closing unit for opening and closing the cover of a substrate accommodation container mounted on the mounting stand mainly includes the cap opening and closing mechanism 102. The cap opening and closing mechanism 102 opens and closes the door 105 for closing the wafer loading/unloading hole 104 and the cap of the pod 101. By opening the cap of the pod 101 mounted on the I/O stage 100 and the door 105, a wafer 200 within the pod 101 can be carried in and out. Further, the pod 101 is supplied to the I/O stage 100 or discharged from the I/O stage 100 by a intra-process transfer device, e.g., automatic guided vehicle (AGV) or overhead hoist transfer (OHT) (not shown).

As shown in FIG. 1, the first processing unit 150, a second processing unit 151, a third processing unit 152, and the fourth processing unit 153 which perform desired processing on a wafer 200 are connected to four side walls of the main body 111 of the first transfer chamber 110, with gate vales 160, 161, 162, and 163 interposed therebetween, respectively.

Reference numeral 108 denotes a controller for controlling the substrate processing apparatus 10, which controls respective components of the substrate processing apparatus 10, such as the cap opening and closing mechanism 102, the notch adjustment device 107, the first wafer transfer device 112, etc.

The processing units 150, 151, 152, and 153 may process the same types of substrates, or may process different types of substrates depending on the purpose of the substrate processing apparatus 10.

In the present embodiment, it is assumed that the processing units 150, 151, 152, and 153 process the same types of substrates. Details of the processing units 150, 151, 152, and 153 will be described hereinafter.

Hereinafter, a substrate processing procedure using the substrate processing apparatus 10 having the foregoing configuration will be described. In the substrate processing procedure, the respective components of the substrate processing apparatus 10 are controlled by the controller 108.

First, the pod 101 in which 25 sheets of wafers 200, which are to be processed, have been received is transferred to the substrate processing apparatus 10 by the intra-process transfer device (not shown). As shown in FIGS. 1 and 2, the pod 101 is transferred from the intra-process transfer device and then mounted on the I/O stage 100.

The pod 101 mounted on a plate of the I/O stage 100 is fixed to the plate by a clamp (not shown) and an ID of the pod 101 is read by an ID reading device (not shown) so as to be authenticated. Thereafter, the plate with the pod 101 mounted thereon moves to a dock position where the cap of the pod 101 may be opened or closed.

At the dock position, the door 105 for closing the cap of the pod 101 and the wafer loading/unloading hole 104 is released by the cap opening and closing mechanism 102 to open the wafer loading/unloading hole 104 and the cap of the pod 101. With respect to the pod 101 whose cap is opened, the presence or absence of wafers 200, the number of sheets of wafers 200, or the position of the wafers 200, namely, a mapping state of the wafers 200, within the pod 101 is inspected and checked by a wafer mapping device (not shown). When the wafer mapping device finishes inspecting the wafer mapping state of the wafers 200, it reports the wafer mapping state to the controller 108. A substrate checking unit for checking for the presence or absence of substrates, the position of the substrates, or the number of sheets of substrates within the substrate accommodation container whose cover is opened mainly includes the wafer mapping device.

When the inspecting and checking of the wafer mapping state are terminated, if a wafer 200 within another pod 101 is being processed in the processing chamber 150, 151, 152 or 153, the cap of the pod 101 and the door 105 for closing the loading/unloading hole 104 are closed by the cap opening and closing mechanism 102, closing the wafer loading/unloading hole 104 and the cap of the pod 101. Details of the operation of closing the cap of the pod 101 after the inspection of the wafer mapping state is terminated will be described later.

After the inspection of the wafer mapping state is terminated, if a process timing for processing the pod 101 in the processing chamber approaches, the pod 101 is opened by the pod opener 103.

When the pod 101 is opened by the pod opener 103, the second wafer transfer device 122 installed in the second transfer chamber 120 picks up one sheet of wafer 200 from the pod 101 and mounts it on the notch adjustment device 107.

The notch adjustment device 107 adjusts a notch position or the like of the wafer 200 by moving the mounted wafer 200 in horizontal and vertical directions (X direction and Y direction) or in a circumferential direction.

While the position of the first sheet of wafer 200 is being adjusted by the notch adjustment device 107, the second wafer transfer device 122 picks up a second sheet of wafer 200 from the pod 101, transfers it into the second transfer chamber 120 and waits in the second transfer chamber 120.

After the adjusting of the position of the first sheet of wafer 200 is terminated by the notch adjustment device 107, the second wafer transfer device 122 picks up the first sheet of wafer 200 on the notch adjustment device 107. The second wafer transfer device 122 then mounts the second sheet of wafer 200 maintained by the second wafer transfer device 122 on the notch adjustment device 107. Thereafter, notch adjusting is performed for the second sheet of wafer 200.

Next, the gate valve 130 is opened, the second wafer transfer device 122 loads the first sheet of wafer 200 into the first load lock chamber 131 and transfers it onto the substrate mounting table 133. During this transferring operation, the gate valve 134 at the side of the first transfer chamber 110 is closed, so that the negative pressure within the first transfer chamber 110 is maintained.

When the transferring of the first sheet of wafer 200 to the substrate mounting table 133 is completed, the gate valve 130 is closed and the interior of the first load lock chamber 131 is exhausted by an exhaust device (not shown) to have a negative pressure.

While the atmosphere within the first load lock chamber 131 is being exhausted, the second wafer transfer device 122 picks up the second sheet of wafer 200 from the notch adjustment device 107. When the gate valve 140 is opened, the second wafer transfer device 122 loads the second sheet of wafer 200 into the second load lock chamber 141 and transfers it onto the substrate mounting table 143. Then, the gate valve 140 is closed and the interior of the second load lock chamber 141 is exhausted by the exhaust device (not shown) to have a negative pressure.

The second wafer transfer device 122 repeatedly performs the foregoing operation. In this case, when the first load lock chamber 131 and the second load lock chamber 141 are in a state of having a negative pressure, the second wafer transfer device 122 is stopped at a position immediately before the first load lock chamber 131 or the second load lock chamber 141 and waits, without loading the wafer 200 into the first load lock chamber 131 and the second load lock chamber 141.

When the first load lock chamber 131 is decompressed to have a predetermined pressure value, the gate valve 134 is opened. Subsequently, the first wafer transfer device 112 of the first transfer chamber 110 picks up, for example, the first sheet of wafer 200 from the substrate mounting table 133.

After the first wafer transfer device 112 picks up the first sheet of wafer 200 from the substrate mounting table 133, the gate valve 134 is closed, the interior of the first load lock chamber 131 is returned to have an atmospheric pressure, and a next wafer 200 is prepared to be loaded into the first load lock chamber 131.

In addition, the gate valve 160 of the first processing unit 150 is opened and the wafer transfer device 112 loads the first sheet of wafer 200 into the first processing unit 150. A processing gas is supplied from a gas supply device (not shown) into the first processing unit 150 to perform a desired processing on the first sheet of wafer 200. The substrate processing unit for performing processing on the substrate within the processing chamber mainly includes the substrate mounting table 133, an anode electrode 420, a cathode electrode 430, an exhaust line 410, or the like, as explained hereinafter.

When the second load lock chamber 141 is decompressed to have a predetermined pressure value, the gate valve 144 is opened. Subsequently, the first wafer transfer device 112 of the first transfer chamber 110 picks up, for example, the second sheet of wafer 200 from the substrate mounting table 143.

After the first wafer transfer device 112 picks up the second sheet of wafer 200 from the substrate mounting table 143, the gate valve 144 is closed, the interior of the second load lock chamber 141 is returned to have an atmospheric pressure, and a next wafer 200 is prepared to be loaded into the second load lock chamber 141.

In addition, the gate valve 161 of the second processing unit 151 is opened and the wafer transfer device 112 loads the second sheet of wafer 200 into the second processing unit 151. A processing gas is supplied from the gas supply device (not shown) into the second processing unit 151 to perform a desired processing on the second sheet of wafer 200.

Thereafter, a next wafer 200 is loaded into the third processing unit 152 or the fourth processing unit 153 and a desired processing is performed on the wafer 200 in the similar manner.

When the processing in the first processing unit 150 is terminated, the first wafer transfer device 112 loads the wafer 200 unloaded from the processing unit 150 into the first load lock chamber 131 and mounts it on the substrate mounting table 132.

If there is a non-processed wafer 200 on the substrate mounting table 133 in the first load lock chamber 131, the first wafer transfer device 112 transfers the non-processed wafer 200 from the first load lock chamber 131 to the first transfer chamber 110.

Afterward, the gate valve 134 is closed and the wafer 200, which has been completely processed, is cooled within the first load lock chamber 131, while inert gas is introduced from an inert gas supply device (not shown) connected to the first load lock chamber 131 to return the pressure within the first load lock chamber 131 to an atmospheric pressure.

In the first load lock chamber 131, when a predetermined cooling time has lapsed and the pressure within the first load lock chamber 131 is returned to an atmospheric pressure, the gate valve 130 is opened. Subsequently, the second wafer transfer device 122 of the second transfer chamber 120 picks up the completely processed wafer 200 from the substrate mounting table 132 and unloads it to the second transfer chamber 120, and then, the gate valve 130 is closed.

Thereafter, the second wafer transfer device 122 transfers the completely processed wafer 200 to the pod 101 through the wafer loading/unloading hole 104 of the second transfer chamber 120.

When the desired processing is performed on all of the wafers 200 within the pod 101 through the foregoing processes and, for example, 25 sheets of completely processed wafers 200 are all received in the pod 101, the door 105 for closing the cap of the pod 101 and the wafer loading/unloading hole 104 is closed by the pod opener 103. The closed pod 101 is unloaded from the I/O stage 100 for a further process by the intra-process transfer device (not shown).

The foregoing operation is repeatedly performed to sequentially process, for example, 25 sheets of wafers 200 each time.

Figure 3:
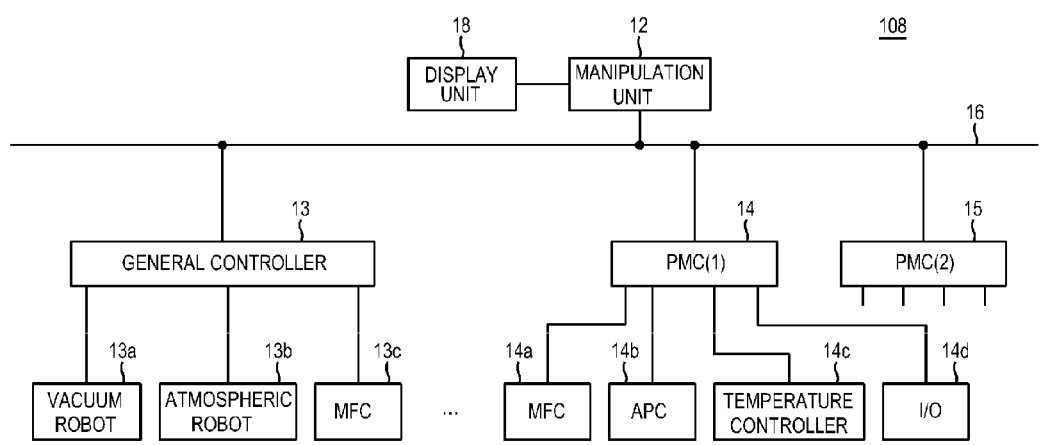
FIG. 3 is a block diagram showing the configuration of a controller for controlling the substrate processing apparatus.

Next, the controller 108 will be described. The controller 108 is configured to execute a control program for performing transfer control or process control by controlling the respective components of the substrate processing apparatus 10, such as the cover opening and closing unit, the substrate checking unit, the substrate processing unit, the substrate transfer mechanism, etc. FIG. 3 is a block diagram showing the configuration of the controller 108 for controlling the substrate processing apparatus 10 illustrated in FIGS. 1 and 2.

In FIG. 3, the controller 108 includes a general controller 13 for controlling the cover opening and closing unit, substrate checking unit, substrate transfer mechanism, etc., a first process chamber controller (PMC)(1) 14 for controlling the first processing unit 150, a second PMC(2) 15 for controlling the second processing unit 151, and a manipulation unit 12 having a storage unit (not shown) for storing a manipulation unit program including the control program, which are connected by a LAN circuit 16.

A vacuum robot controller 13a for controlling the first transfer device 112, an atmospheric robot controller 13b for controlling the second transfer device 122, a mass flow controller (MFC) 13c, etc. are connected to the general controller 13.

The manipulation unit 12 is configured to execute a manipulation unit program used for a graphical user interface (GUI), job controlling (sequence controlling in manufacture), host handling (event/monitoring report of a host, processing of a command from the host), etc.

A MFC 14a, auto-process controller (APC) 14b, temperature controller 14c, valve I/O 14d, etc. are connected to the PMC(1) 14.

Herein, the MFC 14a controls a flow rate of gas, and the APC 14b controls the pressure within the first processing unit 150. Further, the temperature controller 14c controls the temperature within the first processing unit 150, and the valve I/O 14d is an input/output port for controlling an ON/OFF operation of a gas valve or an exhaust valve. The PMC(2) 15 has the same configuration as that of the PMC(1) 14. Meanwhile, although not shown, a PMC(3) for controlling the third processing unit 152 and a PMC(4) for controlling the fourth processing unit 153 have the same configuration as that of the PMC(1) 14 and are connected to the LAN circuit 16 in the same manner.

The manipulation unit 12 includes a display unit 18 for displaying a screen image such as an instruction of a system control command, a monitor display, logging data, alarm interpretation, parameter editing, etc. Further, in the present embodiment, the manipulation unit 12 displays a screen image for setting whether or not to execute a cover opening and closing control program, to be described later.

In addition, instruction data input through a screen image displayed on the display unit 18 or various recipes (process recipe, recipe for a dummy substrate, etc.) are stored in the manipulation unit 12. Further, a program for performing wafer mapping in the present embodiment, or a manipulation unit program including the cover opening and closing control program, to be described later, is stored in the storage unit of the manipulation unit 12.

The general controller 13 controls the operation of the entire system, the vacuum robot controller 13a, the atmospheric robot controller 13b, the MFC 13c, and a gas supply exhaust system for controlling a valve, a pump, or the like.

Next, an operation example of the controller 108 illustrated in FIG. 3 will now be described.

When the pod 101 transferred by the intra-process transfer device is mounted on the I/O stage 100, the general controller 13 opens the cap of the pod 101, and inspects and checks a wafer mapping state of the wafers 200 within the pod 101 by the wafer mapping device (not shown). After the wafer mapping state inspection is terminated, if a wafer 200 within another pod 101 is being processed in the processing chamber, the general controller 13 closes the cap of the pod 101.

When the general controller 13 receives a command as a manufacturing instruction with respect to a certain pod 101 from a high level host computer of the manipulation unit 12 or the substrate processing apparatus 10, the general controller 13 opens the cap of the pod 101 and instructs the atmospheric robot controller 13b to transfer a wafer 200. Then, the atmospheric robot controller 13b controls the second transfer device 122 to transfer the wafer 200 from the pod 101 to the load lock chambers 131 and 141 through the notch adjustment device 107. When the wafer 200 is transferred, the general controller 13 executes an exhaustion control (i.e., controlling of a pump or a valve) of the load lock chambers 131 and 141. When the load lock chambers 131 and 141 reach a predetermined negative pressure, the general controller 13 instructs the vacuum robot controller 13a to transfer the wafer 200 to the first processing unit 150.

Subsequently, the general controller 13 instructs the PMC (1) 14, PMC(2) 15 or the like to execute a predetermined process on the wafer 200, and the predetermined process is performed on the wafer 200. When the wafer 200 is completely processed, the wafer 200 is transferred from the first processing unit 150 to the load lock chambers 131 and 141, and, after the load lock chambers 131 and 141 are returned to the atmospheric pressure, the wafer 200 is transferred to the original pod 101. However, if a different pod is designated in advance, the wafer 200 may be transferred to the designated pod instead of the original pod 101.

Figure 4:
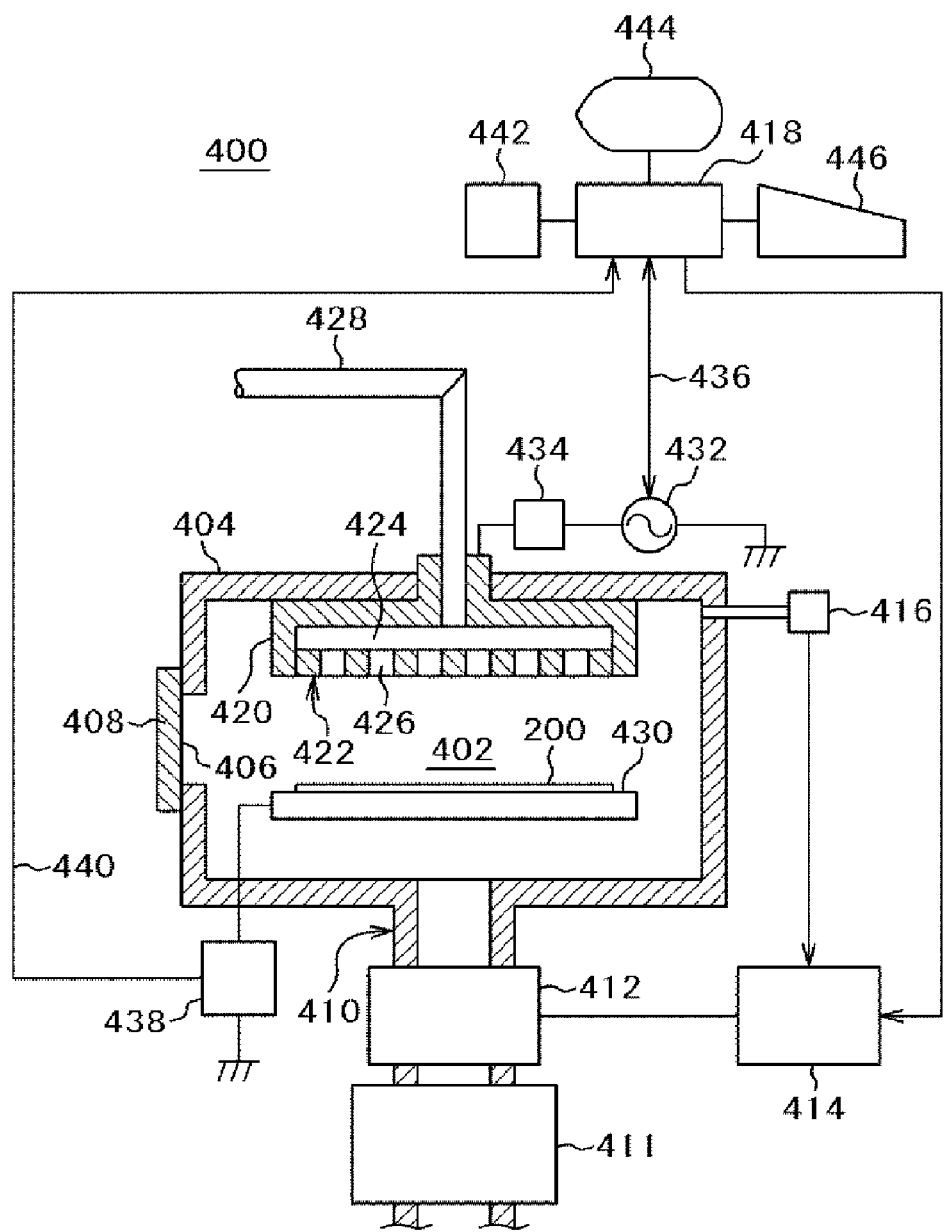
FIG. 4 is a side sectional view of a processing unit of the substrate processing apparatus.

Next, a processing unit will be described with reference to FIG. 4. FIG. 4 is a side sectional view of a processing unit according to the present embodiment. In FIG. 4, a plasma processing device 400 is illustrated as an example of a processing device that may be used in at least one of the plurality of processing units 150, 151, 152, and 153. As illustrated in FIG. 4, the plasma processing device 400 includes a vacuum container 404 which forms a processing chamber 402. A wafer loading/unloading hole 406 for loading and unloading a wafer 200 as a substrate to be processed into and from the processing chamber is installed on a side wall of the vacuum container 404. The wafer loading/unloading hole 406 is configured to be opened and closed by a gate valve 408.

One end of the exhaust line 410 is connected to a lower wall of the vacuum container 404, and the other end of the exhaust line 410 is connected to a vacuum exhaust device 411 as a vacuum exhaust means. An exhaust conductance adjustment valve 412 as an exhaust conductance adjustment means is installed midway of the exhaust line 410. An exhaust conductance adjustment valve control device 414 is electrically connected to the exhaust conductance adjustment valve 412, and a pressure sensor 416 for detecting the pressure within the processing chamber 402 is electrically connected to the exhaust conductance adjustment valve control device 414. The exhaust conductance adjustment valve control device 414 is configured to adjust the pressure within the processing chamber 402 by controlling the exhaust conductance adjustment valve 412 based on a detection result from the pressure sensor 416 and a command from the controller 108.

The anode electrode (positive electrode) 420 is installed within the processing chamber 402 of the vacuum container 404. A gas passage 424 is formed within the anode electrode 420, and a shower plate 422 is installed at a lower portion of the anode electrode 420 to define the gas passage 424. A plurality of inlet/outlet holes 426 are provided in the shower plate 422 to input and output gas in a form of shower. A gas introduction line 428 as a gas introduction means is connected to the gas passage 424 of the anode electrode 420, and various types of gases may be introduced from the gas introduction line 428 to the gas passage 424.

Meanwhile, the cathode electrode (negative electrode) 430 is installed at a lower portion of the processing chamber 402 of the vacuum container 404. The cathode electrode 430 is configured to be also used as a substrate mounting table (susceptor) for maintaining a wafer 200 mounted thereon, and further, a heater (not shown) for heating the maintained wafer 200 is installed in the cathode electrode 430, which is also used as a susceptor.

A high frequency oscillator 432 as a high frequency power supply means is connected between the anode electrode 420 and the cathode electrode 430 through an impedance matching unit 434. The high frequency oscillator 432 is connected to a controller 418 which corresponds to the foregoing PMC(1) 14 (or the PMC(2) 15) through a communication line 436. In addition, the high frequency oscillator 432 is configured to apply a high frequency voltage between the anode electrode 420 and the cathode electrode 430 through the impedance matching unit 434 in response to a command from the controller 418.

A voltmeter 438 as a self-bias voltage detection means is connected to the cathode electrode 430. The voltmeter 438 is configured to transmit a detection result to the controller 418 through a communication line 440. A storage device 442, a display device 444, and an input device 446 are connected to the controller 418. Herein, the controller 418 corresponds to the foregoing PMC(1) 14. Further, although a case in which the storage device 442 is separately provided is taken as an example, a memory or the like installed within the controller 418 may also be used.

The controller 418 may have a function of managing a progressive wave electric energy and an accumulated self-bias voltage as a software function. Thus, the controller 418 may be configured to obtain a progressive wave power value as data regarding plasma processing from the high frequency oscillator 432 through the communication line 436, and store the same in the storage device 442. In addition, the controller 418 may be configured to obtain a self-bias voltage value as data regarding plasma processing from the voltmeter 438 through the communication line 440, and store the same in the storage device 442.

Next, a method of forming a film on a wafer 200 by the plasma processing device 400 relating to the foregoing configuration will be described.

When the wafer 200 on which a film is to be formed is transferred to the wafer loading/unloading hole 406, the gate valve 408 is opened and the wafer 200 is loaded into the processing chamber 402 from the wafer loading/unloading hole 406 and mounted on the cathode electrode 430, which also serves as a susceptor. When the wafer 200 is installed on the cathode electrode 430 and maintained, the wafer loading/unloading hole 406 is closed by the gate valve 408. The interior of the processing chamber 402 is exhausted by the vacuum exhaust device 411 through the exhaust line 410 and the exhaust conductance adjustment valve 412.

While the interior of the processing chamber 402 is maintained to have a certain pressure, a raw gas is introduced from the gas introduction line 428 to the gas passage 424, and input and output in a shower form from the inlet/outlet holes 426 of the shower plate 422 within the processing chamber 402. In order to uniformly maintain the pressure within the processing chamber 402, a feedback control method of controlling the exhaust conductance adjustment valve 412 based on a signal which is output from the pressure sensor 416 and input to the exhaust conductance adjustment valve control device 414 is used.

With the interior of the processing chamber 402 maintained to have a certain pressure, a power value inputted from the input device 446 to the controller 418 is set in the high frequency oscillator 432 through the communication line 436, and high frequency power is generated by the high frequency oscillator 432. The high frequency power generated by the high frequency oscillator 432 is applied to the anode electrode 420 through the impedance matching unit 434. When the high frequency power is applied, plasma is generated between the anode electrode 420 and the cathode electrode 430. Using the generated plasma, the raw material gas input and output in the form of a shower within the processing chamber 402 is decomposed or activated, and deposited on the wafer 200 maintained on the cathode electrode 430, which also serves as a susceptor, thus forming a film on the wafer 200.

Figure 5:
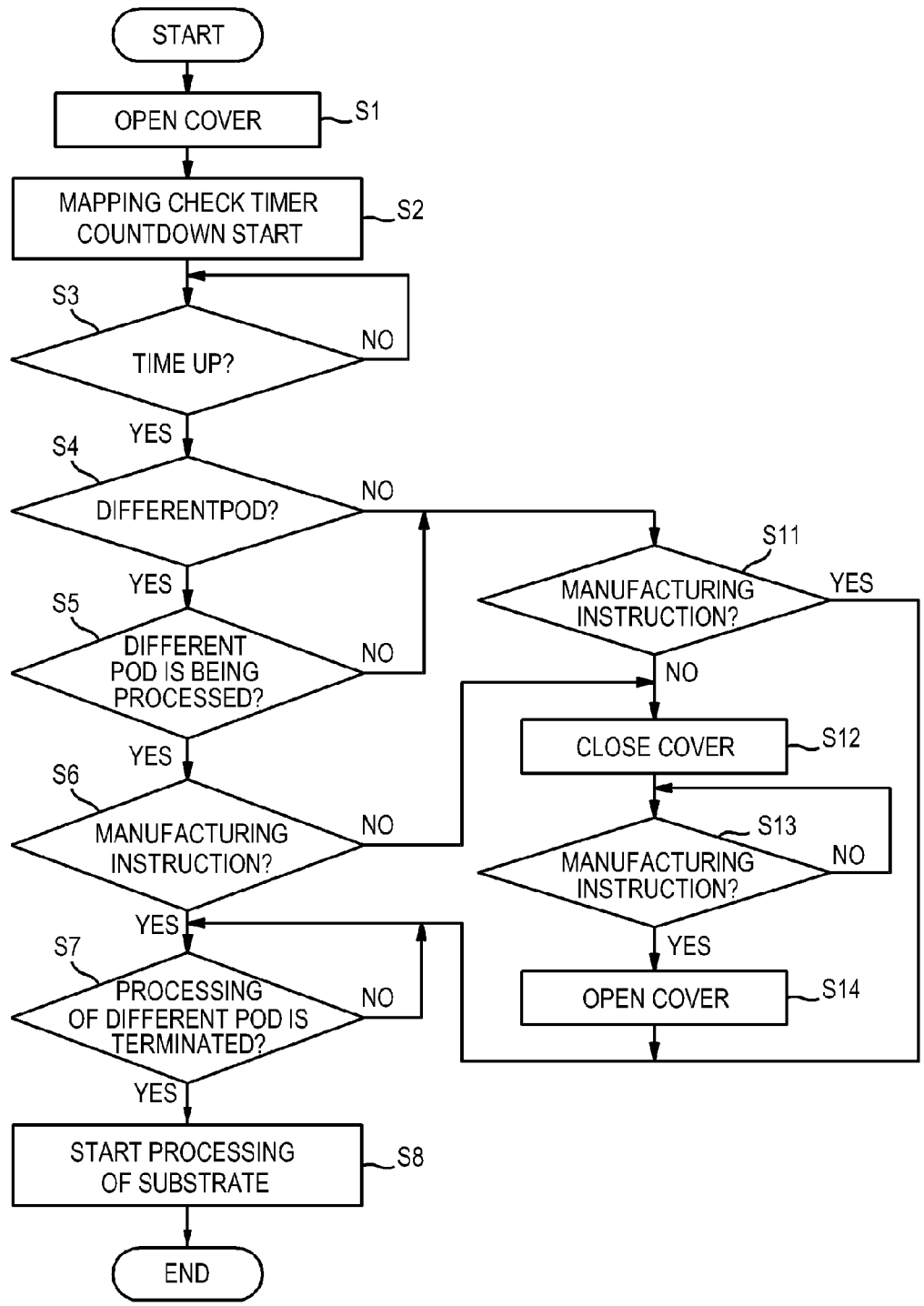
FIG. 5 is a flowchart illustrating an operation of opening and closing a cover of a substrate accommodation container of the substrate processing apparatus.

Next, an operation of opening and closing the cap of the pod 101 before or after the wafer mapping state inspection by the wafer mapping device will be described in detail with reference to FIG. 5. FIG. 5 is a flowchart illustrating an operation of opening and closing a cover of a substrate accommodation container, that is, the cap of the pod 101. The opening and closing operation in FIG. 5 is realized by allowing a cover opening and closing control program to be executed by the controller 108.

As described above, the cap of the pod 101 loaded on the I/O stage 100 is removed by the cap opening and closing mechanism 102 at a dock position to open the wafer loading/unloading hole 104 and the cap of the pod 101 (step S1). When the cap of the pod 101 is opened, a wafer mapping state of the wafers 200 within the pod 101 with the cap opened is inspected and checked by the wafer mapping device (not shown).

After the wafer mapping is checked, a closing timer (not shown) starts to count time before the cap of the pod 101 is closed (step S2). The operation waits until the closing timer times out (i.e., until a predetermined time lapses) (step S3).

When the closing timer times out (Yes in step S3), it is determined whether or not a different pod 101 exists on the I/O stage 100 (step S4).

The reason for installing the closing timer and closing the cap of the pod 101 after the lapse of the predetermined time from the time at which the cap of the pod 101 is opened, namely, the reason for opening the cap of the pod 101, performing the wafer mapping, and providing a delay time from the termination of the wafer mapping to the closing of the cap is to omit an unnecessary cap closing operation after the wafer mapping is terminated. When a different pod 101 does not exist on the I/O stage 100, a manufacturing instruction is issued from a host computer or the like after the wafer mapping is terminated. For this reason, if the delay time from the termination of the wafer mapping to the closing of the cap of the pod 101 is not provided, the cap of the pod 101 is closed after termination of the wafer mapping, and then, when a manufacturing instruction is received, the cap of the pod 101 is re-opened.

Meanwhile, the closing timer may not be necessarily installed. Further, it may be set by the manipulation unit 12 whether a closing timer function is used.

If a different pod 101 does not exist on the I/O stage 100 (No in step S4), it is determined whether or not a manufacturing instruction, namely, an instruction for performing processing on the wafer 200 within the pod 101, for which the wafer mapping was checked, in the processing chamber has been issued from the host computer or the like (step S11).

If a manufacturing instruction has been issued (Yes in step S11), the cap of the pod 101 is maintained in the opened state, rather than being closed, and the process proceeds to steps S7 and S8 to start processing on the wafer 200. Specifically, the wafer 200 within the pod 101 is transferred to, for example, the load lock chamber (spare chamber and cooling chamber) 131 through the notch adjustment device 107 by the second transfer device 122, and then transferred by the first wafer transfer device 112 to, for example, the first processing unit 150 to be processed.

If a manufacturing instruction is not issued (No in step S11), the cap of the pod 101 is closed by the cap opening and closing mechanism 102 (step S12), and the operation waits until a manufacturing instruction is issued (step S13). If manufacturing instruction is issued (Yes in step S13), the cap of the pod 101 is opened by the cap opening and closing mechanism 102 (step S14), the process proceeds to the steps S7 and S8, and processing on the wafer 200 starts.

If a different pod 101 exists on the I/O stage 100 (Yes in step S4), it is determined whether or not the wafer 200 in the different pod 101 is being processed (step S5), and if the wafer is not being processed (No in step S5), the operation proceeds to the foregoing step S11.

Herein, the state in which the wafer 200 within the different pod 101 is being processed will be described. When a manufacturing instruction is issued from the host computer or the like, the wafer 200 within the pod 101 on the I/O stage 100 is transferred to, for example, the load lock chamber 131 through the notch adjustment device 107, and then, transferred from the load lock chamber 131 to, for example, the first processing unit 150 to be processed. Thereafter, the process-completed wafer 200 is transferred from the first processing unit 150 to the load lock chamber 131, and then returned into the pod 101 on the I/O stage 100 from the load lock chamber 131.

The state in which the wafer 200 within the different pod 101 is being processed refers to a state from when a manufacturing instruction is issued from the host computer or the like, with respect to the different pod 101, until a final non-processed wafer 200 (e.g., if 25 sheets of wafers 200 exist within the pod 101, 24 sheets of wafers 200 have been completely processed and the remaining $25^{th}$ wafer 200 is a non-processed wafer 200) within the different pod 101 is transferred to, for example, the first processing unit 150, processed, and returned into the pod 101 on the I/O stage 100. In this case, the different pod 101 may belong to a previous lot or the same lot.

When the wafer 200 within the different pod 101 is being processed (Yes in step S5), it is determined whether or not a manufacturing instruction has been issued from the host computer or the like, with respect to the pod 101 for which the wafer mapping was checked (step S6). If the manufacturing instruction has not been issued (No in step S6), the operation proceeds to the foregoing step S12, the cap of the pod 101 is closed, and the operation waits until a manufacturing instruction is issued.

In the present embodiment, in the case that a plurality of pods 101 exist on the I/O stage 100, a manufacturing instruction for the pod 101 is issued from the host computer or the like when the controller 108 mounts the final non-processed wafer 200 within the different pod 101, which is being processed while the pod 101 is waiting to be processed, onto the second transfer device 122 from within the different pod 101 on the I/O stage 100, namely, when the controller 108 unloads the final non-processed wafer 200 by the substrate transfer mechanism. Thus, after the wafer mapping is terminated, when a process timing in the processing chamber approaches, the pod 101 is opened by the pod opener 103. That is, the controller 108 provides control to calculate a timing at which the wafers 200 within the pod 101 start to be processed after the termination of the wafer mapping and open the cover of the pod 101 after the wafer mapping is terminated, according to the calculated timing.

Further, as described above, in the case that a plurality of pods 101 exist on the I/O stage 100, when the final non-processed wafer 200 within the different pod 101, which is being processed while the pod 101 is waiting to be processed, is mounted on the second transfer device 122 from within the pod 101 on the I/O stage 100, a manufacturing instruction is issued from the host computer or the like. Accordingly, when the manufacturing instruction is issued, since the cap of the pod 101 is maintained in an opened state, without being closed, throughput can be improved as compared to a case in which the cap of the pod 101 is to be opened after processing the different pod 101.

In the present embodiment, an operation time for opening the cap of the pod 101 is about 10 seconds, an operation time for closing the cap is about 3 seconds, and a duration from a point in time at which the final non-processed wafer within a pod 101, which is being processed beforehand, is unloaded from within the pod 101 on the I/O stage 100 to a point in time at which a first non-processed wafer within a pod 101 to be processed next starts to be unloaded from within the pod 101 on the I/O stage 100 is about 20 seconds.

When a manufacturing instruction is issued (Yes in step S6), the cap of the pod 101 is maintained in an opened state, without being closed, and the operation waits until the processing of the different pod 101 on the I/O stage 100 is terminated (step S7), and then the substrate (wafer 200) starts to be processed (step S8).

In this manner, at the timing of the termination of the wafer mapping, if the time until the wafer 200 within the pod 101 starts to be processed after the termination of the wafer mapping is shorter than a predetermined time, the controller 108 maintains the opened state of the cover of the pod 101 after the termination of the wafer mapping, and if the time is longer than the predetermined time, the controller 108 provides control to close the cover of the pod 101 after the termination of the wafer mapping.

In the foregoing embodiment, the operation of opening and closing the cap of the pod 101 is realized by executing the cover opening and closing control program when the substrate accommodation container is mounted on the substrate mounting stand, but it may be configured such that whether to execute the cover opening and closing program, which performs the operation of FIG. 5, is selected. The selection may be performed based on an instruction from the manipulation unit by a manipulator or may be automatically performed by the controller based on the content of a previous process.

Figure 6:
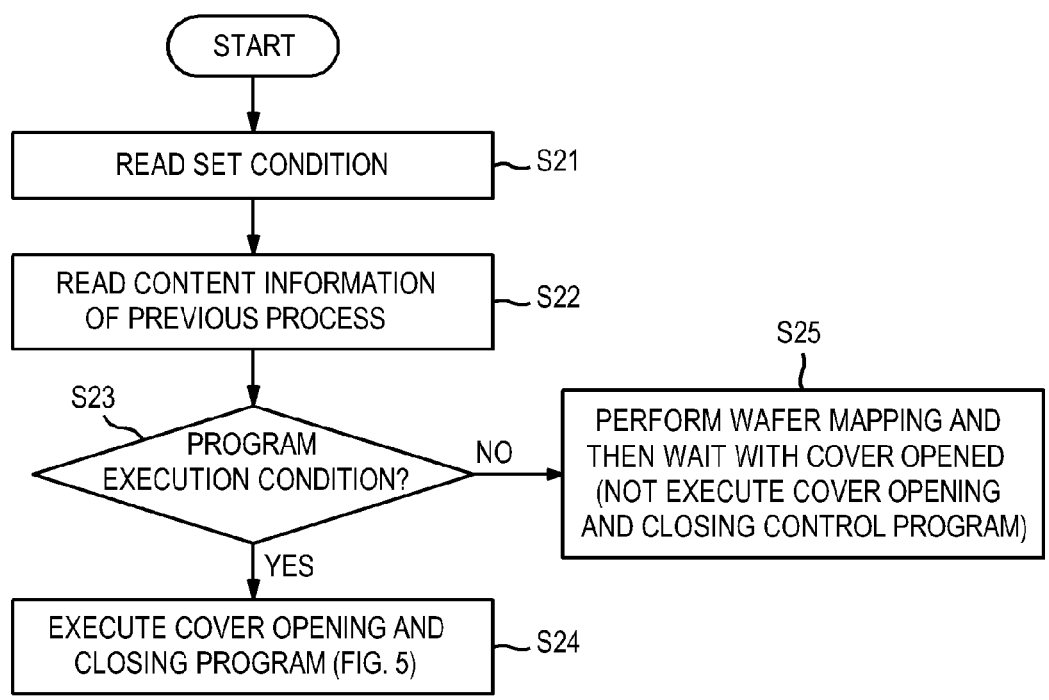
FIG. 6 is a flowchart illustrating an operation of the controller in a configuration example for executing the cover opening and closing operation of FIG. 5 when a predetermined previous processing has been performed.

An example of a configuration in which whether to execute the cover opening and closing control program, which performs the operation of FIG. 5, is selected will now be described with reference to FIG. 6. FIG. 6 is a flowchart illustrating an operation of the controller 108 in a configuration example for executing the cover opening and closing operation of FIG. 5 when a predetermined previous processing has been performed. The operation is configured such that the content of the predetermined previous processing may be, for example, previously set by the manipulator and stored in the storage unit of the manipulation unit 12.

In FIG. 6, when the cover opening and closing control program starts, the controller 108 reads a preset condition which is the content of the previous processing stored in the storage unit of the manipulation unit 12 (step S21). Next, when a pod 101 accommodating a plurality of wafers 200 therein is held on the I/O stage 100, since content information of the previous processing is attached on the pod 101 in a form of, for example, a barcode, the controller 108 reads the content information of the previous processing by using a barcode reader (not shown) installed in the substrate processing apparatus 10 (step S22).

The controller 108 determines whether or not the execution condition of the cover opening and closing control program is met (step S23). If the execution condition of the cover opening and closing control program is met, namely, the set condition stored in the manipulation unit 12 and the content information of the previous processing attached on the pod 101 are identical (Yes in step S23), the cover opening and closing control program is executed (step S24). If the set condition stored in the manipulation unit 12 and the content information of the previous processing attached on the pod 101 are not identical (No in step S23), the cover of the pod 101 is opened and the wafer mapping state of the wafers 200 within the pod 101 is inspected and checked by the wafer mapping device, as shown in step S2 in FIG. 5, without executing the cover opening and closing control program. Thereafter, the pod 101 enters a standby state and waits for a manufacturing instruction (step S25).

The embodiment as described above attains the following effects (1) to (7).

(1) When a second pod 101 is mounted on the I/O stage 100 while a wafer 200 within a first pod 101 mounted on the I/O stage 100 is being processed, it is controlled such that the cover of the second pod 101 is opened, wafer mapping is performed on the wafers 200 within the second pod 101, and then, the cover is again closed. Thus, the attachment of particles to the surface of the wafers 200, contamination of the surface of the wafers 200, or the like that may be caused by the wafers 200 within the second pod 101 being exposed in the air with the cover of the second pod 101 opened can be suppressed.

(2) When a final non-processed wafer 200 within the first pod 101 being processed starts to be processed, it is controlled such that the cover of the second pod 101 in a standby state is opened. Thus, when the processing on the wafers 200 within the second pod 101 starts, it is not necessary to wait for the cover of the second pod 101 to be opened, thus enhancing throughput.

(3) A timing at which processing on the wafers 200 within the second pod 101 starts is calculated, and the cover of the second pod 101 is controlled to be opened based on the calculated timing. Thus, before a timing at which processing on the wafers 200 within the second pod 101 is expected to start, the cover of the second pod 101 can be reliably opened.

(4) It can be configured such that, in a state in which another pod 101 does not exist on the I/O stage 100, after the wafer mapping, a processing command (manufacturing instruction) with respect to the wafers 200 within the corresponding pod 101 waits for a predetermined time with the cover of the pod 101 opened, so that an unnecessary cover opening and closing operation is not performed, thus enhancing throughput.

(5) It can be configured such that whether to perform controlling of closing the cover after wafer mapping is selectable based on an instruction from the manipulation unit by the manipulator. With this configuration, for example, whether to execute the cover opening and closing control program may be selected, for example, depending on a state of the surface of the wafer 200. In the case of a process in which particle attachment to the surface of a wafer 200 is not a problem or a process in which a change in the quality of a film formed on the surface of a wafer 200 due to exposure in the air within the substrate processing apparatus 10 is not a problem, the cover opening and closing control program of FIG. 5 may not be executed, thereby flexibly coping with the situation.

(6) It can be configured such that whether to perform controlling of closing the cover after wafer mapping is automatically selected based on the content of a previous processing. Thus, a change in the quality of the film formed on the surface of the substrate in a previous processing can be restrained with respect to the substrate within the substrate accommodation container in a standby state.

(7) Since it may be configured such that whether to perform controlling of closing the cover after wafer mapping is automatically selected based on the content of a previous processing, in particular, according to the flowchart of FIG. 6, when the condition set by the manipulation unit and the content of the previous processing are identical, the controlling of closing the cover after wafer mapping may be performed, and when the condition set by the manipulation unit and the content of the previous processing are not identical, the controlling of closing the cover after wafer mapping may not be performed. Thus, regardless of the content of the previous processing, attachment of particles can be reduced and degradation of throughput can be restrained.

In addition, it is needless to say that the present disclosure is not limited to the foregoing embodiments, but various changes may be made within the range that does not depart from the general idea thereof.

Further, the present disclosure can be applicable to an apparatus for processing a glass substrate such as an LCD manufacturing apparatus, and any other substrate processing apparatus, as well as to an apparatus for manufacturing a semiconductor. The substrate processing may be CVD, PVD, film formation processing of forming an oxide film, a nitride film, a metal contained film and the like, and exposure processing, lithography, coating processing and the like.

According to some embodiments, a substrate processing apparatus includes a mounting stand on which a substrate accommodation container accommodating a plurality of substrates therein is held, a cover opening and closing unit configured to open and close a cover of the substrate accommodation container mounted on the mounting stand, a substrate checking unit configured to check for the presence or absence or a position of a substrate within the substrate accommodation container with a cover thereof being opened, a substrate transfer mechanism configured to transfer a substrate within the substrate accommodation container to a processing chamber, a substrate processing unit configured to perform processing on the substrate within the processing chamber which has been transferred by substrate transfer mechanism, and a controller configured to control the operation of the cover opening and closing unit, substrate checking unit, substrate processing unit, and substrate transfer mechanism, wherein the substrate accommodation container includes a first substrate accommodation container and a second substrate accommodation container, and, while the substrate processing unit is processing a substrate transferred from the first substrate accommodation container to the processing chamber by the substrate transfer mechanism, when the second substrate accommodation container is mounted on the mounting stand, the controller provides control to open the cover of the second substrate accommodation container and check a substrate within the second substrate accommodation container by means of the substrate checking unit, and when the substrate checking is terminated, the controller provides control to close the cover of the second substrate accommodation container.

According to some other embodiments, when a final non-processed substrate within the first substrate accommodation container is unloaded by the substrate transfer mechanism, or when a timing for starting processing on the substrates within the second substrate accommodation container approaches, the controller provides control to open the cover of the second substrate accommodation container.

According to some other embodiments, while the substrate processing unit is processing a substrate within the first substrate accommodation container mounted on the mounting stand, the controller calculates a timing at which the substrate processing on the substrates within the second substrate accommodation container starts, and provides control to open the cover of the second substrate accommodation container based on the calculated timing.

According to some other embodiments, in a state in which a different substrate accommodation container does not exist on the mounting stand, when the second substrate accommodation container is mounted on the mounting stand, the controller provides control to open the cover of the second substrate accommodation container and check the substrate within the second substrate accommodation container by means of the substrate checking unit, and when the substrate checking is terminated, the controller provides control to maintain the opened state of the cover of the second substrate accommodation container.

According to some other embodiments, a substrate processing apparatus includes a mounting stand on which a substrate accommodation container accommodating a plurality of substrates therein is held, a cover opening and closing unit configured to open and close a cover of the substrate accommodation container mounted on the mounting stand, a substrate checking unit configured to check for the presence or absence or a position of a substrate within the substrate accommodation container with a cover thereof being opened, a substrate transfer mechanism configured to transfer a substrate within the substrate accommodation container to a processing chamber, a substrate processing unit configured to perform processing on the substrate within the processing chamber which has been transferred by substrate transfer mechanism, and a controller configured to control the operation of the cover opening and closing unit, substrate checking unit, substrate processing unit, and substrate transfer mechanism, wherein the substrate accommodation container includes a first substrate accommodation container and a second substrate accommodation container, and while the substrate processing unit is processing a substrate transferred from the first substrate accommodation container to the processing chamber by the substrate transfer mechanism, when the second substrate accommodation container is mounted on the mounting stand, the controller provides control to open the cover of the second substrate accommodation container and check a substrate within the second substrate accommodation container by means of the substrate checking unit, and when the substrate checking is terminated, the controller provides control to select whether to close the cover of the second substrate accommodation container.

According to some other embodiments, while the substrate processing unit is processing a substrate within the first substrate accommodation container mounted on the mounting stand, when the second substrate accommodation container is mounted on the mounting stand, the controller provides control to open the cover of the second substrate accommodation container and check the substrates within the second substrate accommodation container by means of the substrate checking unit, and when the substrate checking is terminated, the controller provides control to select whether to close the cover of the second substrate accommodation container based on processing performed in a previous process of the substrate processing apparatus with respect to the substrates within the second substrate accommodation container.

According to some other embodiments, a substrate processing apparatus includes a mounting stand on which a substrate accommodation container accommodating a plurality of substrates therein is held, a cover opening and closing unit configured to open and close a cover of the substrate accommodation container mounted on the mounting stand, a substrate checking unit configured to check for the presence or absence or a position of a substrate within the substrate accommodation container with a cover thereof being opened, a substrate transfer mechanism configured to transfer a substrate within the substrate accommodation container to a processing chamber, a substrate processing unit configured to perform processing on the substrate within the processing chamber which has been transferred by substrate transfer mechanism, a manipulation unit configured to receive an instruction from a manipulator, and a controller configured to control the operation of the cover opening and closing unit, substrate checking unit, substrate processing unit, substrate transfer mechanism, and manipulation unit, wherein the substrate accommodation container includes a first substrate accommodation container and a second substrate accommodation container, and while the substrate processing unit is processing a substrate transferred from the first substrate accommodation container to the processing chamber by the substrate transfer mechanism, when the second substrate accommodation container is mounted on the mounting stand, the controller provides control to open the cover of the second substrate accommodation container and check a substrate within the second substrate accommodation container by means of the substrate checking unit, and when the substrate checking is terminated, the controller provides control to select whether to close the cover of the second substrate accommodation container based on the instruction from the manipulation unit.

According to some other embodiments, a method for fabricating a semiconductor device includes a mounting process of mounting a substrate accommodation container accommodating a plurality of substrates on a mounting stand, a first opening process of opening a cover of the substrate accommodation container mounted on the mounting stand after the mounting process, a checking process of checking for the presence or absence or a position of a substrate within the substrate accommodation container with the cover thereof being opened in the first opening process, a closing process of closing the cover of the substrate accommodation container after the checking process, a second opening process of opening the cover of the substrate accommodation container after the closing process, a substrate transfer process of transferring a substrate within the substrate accommodation container with the cover thereof being opened in the second opening process to a processing chamber, and a substrate processing process of performing processing on the substrate transferred to the processing chamber in the substrate transfer process.

According to some other embodiments, a method for transferring a substrate includes a mounting process of mounting a substrate accommodation container accommodating a plurality of substrates on a mounting stand, a first opening process of opening a cover of the substrate accommodation container mounted on the mounting stand after the mounting process, a checking process of checking for the presence or absence or a position of a substrate within the substrate accommodation container with the cover thereof being opened in the first opening process, a closing process of closing the cover of the substrate accommodation container after the checking process, a second opening process of opening the cover of the substrate accommodation container after the closing process, and a substrate transfer process of transferring a substrate within the substrate accommodation container with the cover thereof being opened in the second opening process to a processing chamber.

According to some other embodiments, a program for controlling a substrate processing apparatus includes a substrate checking process of opening a cover of a second substrate accommodation container and checking for the presence or absence or a position of a substrate within the second substrate accommodation container, while a substrate within a first substrate accommodation container is being processed, and a cover opening and closing process of maintaining an opened state of the cover of the second substrate accommodation container if a time until the substrates within the second substrate accommodation container starts to be processed is shorter than a predetermined time at a timing of the termination of the substrate checking, and closing the cover of the second substrate accommodation container if the time until the substrates starts to be processed is longer than the predetermined time at the timing of the termination of the substrate checking.

According to some other embodiments, a program for controlling opening and closing of a cover of a substrate accommodation container, includes, after performing substrate checking by opening a cover of a second substrate accommodation container and checking for the presence or absence or a position of a substrate within the second substrate accommodation container while a substrate within a first substrate accommodation container is being processed, a cover closing process of closing the cover of the second substrate accommodation container, and a cover opening process of opening the cover of the second substrate accommodation container when a timing at which the substrates within the second substrate accommodation container start to be processed approaches after the cover closing process.

According to some other embodiments, at a timing of the termination of the substrate checking, if a time until the substrates within the second substrate accommodation container starts to be processed is shorter than a predetermined time, the controller provides control to maintain the opened state of the cover of the second substrate accommodation container, and if the time until the substrates starts to be processed is longer than the predetermined time, the controller provides control to close the cover of the second substrate accommodation container.

When the substrate processing apparatus is configured as described above, while a substrate within a certain substrate accommodation container is being processed, a next substrate accommodation container can be transferred and a predetermined process such as wafer mapping or the like can be executed, and then, the cover thereof can be automatically closed. Thus, the attachment of particles to the substrates within the next substrate accommodation container can be reduced.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
    a mounting stand configured to hold at least one substrate accommodation container accommodating a plurality of substrates;
    a cover opening and closing unit configured to open and close a cover of the at least one substrate accommodation container mounted on the mounting stand;
    a substrate checking unit configured to check for presence or absence or a position of the substrates within the at least one substrate accommodation container;
    a substrate transfer mechanism configured to transfer one or more substrates within the at least one substrate accommodation container to one or more processing chambers;
    a substrate processing unit configured to perform processing on the transferred substrates within the one or more processing chambers; and
    a controller configured to control the operation of the cover opening and closing unit, the substrate checking unit, the substrate processing unit, and the substrate transfer mechanism,
    wherein when a first substrate accommodation container is mounted on the mounting stand, the controller provides control to the opening and closing unit to open a cover of the first substrate accommodation container and check one or more substrates within the first substrate accommodation container by means of the substrate checking unit,
    wherein at the time the checking for presence or absence or a position of the one or more substrates within the first substrate accommodation container is terminated, the controller determines whether an instruction for performing processing on the one or more substrates within the first substrate accommodation container is issued, and controls the cover opening and closing unit based on the determination,
    wherein the controller issues the instruction for performing processing on the one or more substrates within the first substrate accommodation container when a second substrate accommodation container being processed by the substrate processing unit does not exist on the mounting stand, or when a final non-processed substrate within the second substrate accommodation container is unloaded from the second substrate accommodation container by the substrate transfer mechanism, and
    wherein if the instruction for performing processing on the one or more substrates within the first substrate accommodation container is issued, the controller controls the cover opening and closing unit to maintain the opened state of the cover of the first substrate accommodation container, and if the instruction for performing processing on the one or more substrates within the first substrate accommodation container is not issued, the controller controls the cover opening and closing unit to close the cover of the first substrate accommodation container.

2. The substrate processing apparatus of claim 1, wherein, while the cover of the first substrate accommodation container is closed and the second substrate accommodation container is mounted on the mounting stand from which the one or more substrates from the second substrate accommodation container are being transferred via the substrate transfer mechanism or being processed by the substrate processing unit, the controller calculates a timing at which processing on the one or more substrates within the first substrate accommodation container starts, and provides control to open the cover of the first substrate accommodation container based on the calculated timing.

3. The substrate processing apparatus of claim 1, wherein, at the time the process of checking for presence or absence or a position of a substrate within the first substrate accommodation container is terminated, control is provided to select whether to close the cover of the first substrate accommodation container.

4. The substrate processing apparatus of claim 1, wherein, at the time the process of checking for presence or absence or a position of a substrate within the first substrate accommodation container is terminated, control is provided to select whether to close the cover of the first substrate accommodation container based upon previous processing performed by the substrate processing unit.

5. The substrate processing apparatus of claim 1, further comprising a manipulation unit configured to issue an instruction for,
    at the time the process of checking for presence or absence or a position of a substrate within the first substrate accommodation container is terminated, providing control to select whether to close the cover of the first substrate accommodation container.

6. The substrate processing apparatus of claim 1, further comprising a closing timer configured to set a delay time until the cover of the first substrate accommodation container is closed,
    wherein at the time the process of checking for presence or absence or a position of a substrate within the first substrate accommodation container is terminated, the controller starts the closing timer.

7. The substrate processing apparatus of claim 1, further comprising a closing timer configured to set a delay time until the cover of the first substrate accommodation container is closed,
    wherein at the time the process of checking for presence or absence or a position of a substrate within the first substrate accommodation container is terminated, the controller starts the closing timer, and
    wherein at the time the closing timer times out, the controller controls the cover opening and closing unit to maintain the opened state of the cover of the first substrate accommodation container if the instruction for performing processing on the one or more substrates within the first substrate accommodation container is issued, and controls the cover opening and closing unit to close the cover of the first substrate accommodation container if the instruction for performing processing on the one or more substrates within the first substrate accommodation container is not issued.

8. The substrate processing apparatus of claim 1, further comprising a storage unit that stores a preset condition which is a content of a predetermined previous processing,
    wherein the controller reads content information of a previous processing, which is attached on the first substrate accommodation container, when the first substrate accommodation container is held on the mounting stand, and
    wherein if the preset condition and the content information is identical, the controller executes a cover opening and closing control program, and if the preset condition and the content information is not identical, the controller controls the substrate checking unit to check for presence or absence or a position of the substrates within the first substrate accommodation container and then controls the cover opening and closing unit to maintain the opened state of the cover of the first substrate accommodation container.

9. A method for fabricating a semiconductor device, comprising:
 a first opening process of opening a cover of a first substrate accommodation container accommodating a plurality of substrates mounted on a mounting stand;
 a checking process of checking for presence or absence or a position of a substrate within the first substrate accommodation container with the cover thereof being opened in the first opening process;
 an issuing process of issuing an instruction for performing processing on the one or more substrates within the first substrate accommodation container when a second substrate accommodation container being processed by the substrate processing unit does not exist on the mounting stand, or when a final non-processed substrate within the second substrate accommodation container is unloaded from the second substrate accommodation container;
 a closing process of closing the cover of the first substrate accommodation container at the time the checking process is terminated, wherein opening and closing of the cover is controlled based on a determination whether the instruction for performing processing on the one or more substrates within the first substrate accommodation container is issued, and wherein if the instruction for performing processing on the one or more substrates within the first substrate accommodation container is issued, the cover of the first substrate accommodation container is maintained in the opened state, and if the instruction for performing processing on the one or more substrates within the first substrate accommodation container is not issued, the cover of the first substrate accommodation container is closed;
 a second opening process of opening the cover of the first substrate accommodation container after the closing process;
 a substrate transfer process of transferring a substrate within the first substrate accommodation container to a processing chamber; and
 a substrate processing process of performing processing on the substrate transferred to the processing chamber in the first substrate transfer process.

10. A non-transitory computer-readable recording medium storing thereon a program for controlling a substrate processing apparatus, the program comprising:
 a first opening process of opening a cover of a first substrate accommodation container mounted on a mounting stand;
 a checking process of checking for presence or absence or a position of a substrate within the first substrate accommodation container with the cover thereof being opened in the first opening process;
 an issuing process of issuing an instruction for performing processing on the one or more substrates within the first substrate accommodation container when a second substrate accommodation container being processed by the substrate processing unit does not exist on the mounting stand, or when a final non-processed substrate within the second substrate accommodation container is unloaded from the second substrate accommodation container;
 a closing process of closing the cover of the first substrate accommodation container at the time the checking process is terminated wherein, if the instruction for performing processing on the one or more substrates within the first substrate accommodation container is not issued, the cover of the first substrate accommodation container is closed;
 a second opening process of opening the cover of the first substrate accommodation container after the closing process;
 a control process for opening and closing the cover of the first substrate accommodation container, wherein, at the time the checking process is terminated, opening and closing of the cover is controlled based on a determination whether the instruction for performing processing on the one or more substrates within the first substrate accommodation container is issued, and wherein if the instruction for performing processing on the one or more substrates within the first substrate accommodation container is issued, the cover of the first substrate accommodation container is maintained in an open state, and if the instruction for performing processing on the one or more substrates within the first substrate accommodation container is not issued, the cover of the first substrate accommodation container is closed.

* * * * *